US006537885B1

(12) United States Patent
Kang et al.

(10) Patent No.: US 6,537,885 B1
(45) Date of Patent: Mar. 25, 2003

(54) TRANSISTOR AND METHOD OF MANUFACTURING A TRANSISTOR HAVING A SHALLOW JUNCTION FORMATION USING A TWO STEP EPI LAYER

(75) Inventors: Woo-Tag Kang, Wappinger Falls, NY (US); Kil-Ho Lee, Wappinger Falls, NY (US)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/142,537

(22) Filed: May 9, 2002

(51) Int. Cl.[7] ........................................ H01L 21/336

(52) U.S. Cl. ..................... 438/303; 438/182; 438/230; 438/231; 438/300

(58) Field of Search ............................... 438/299–307, 438/182, 230–232, 574, 579; 257/929, 900, 331

(56) References Cited

U.S. PATENT DOCUMENTS 5,079,180 A * 1/1992 Rodder et al. .............. 438/297
5,319,232 A * 6/1994 Pfiester ....................... 257/344
6,063,677 A * 5/2000 Rodder et al. .............. 438/300
6,087,235 A * 7/2000 Yu ............................. 438/300
6,180,978 B1 * 1/2001 Chatterjee et al. .......... 257/327
6,254,676 B1 * 7/2001 Yang et al. ................... 117/95
6,326,664 B1 * 12/2001 Chau et al. ................. 257/344
6,335,214 B1 * 1/2002 Fung ........................... 438/30
6,346,447 B1 * 2/2002 Rodder ........................ 438/300
6,355,533 B2 * 3/2002 Lee ............................ 438/366
6,445,042 B1 * 9/2002 Yu et al. ..................... 257/369

* cited by examiner

*Primary Examiner*—Carl Whitehead, Jr.
*Assistant Examiner*—Thanh Nguyen
(74) *Attorney, Agent, or Firm*—Lerner, David, Littenberg, Krumholz & Mentlik, LLP

(57) ABSTRACT

A method of manufacturing a transistor by using two layers of a silicon epitaxial layer is disclosed. In the first step of the manufacturing process, a spacer is formed around gate structures. Then, a first silicon epitaxial layer is grown on the wafer. Then, a second spacer is deposited and then etched, such that the second spacer remains around a gate structure. Next a second silicon epitaxial layer is grown on the first silicon epitaxial layer, and the second spacer is etched from around the gate structure. After etching the first oxide spacer, ions are implanted at a first energy level to form four junctions. Then a third spacer is deposited and etched, so that the third spacer remains around the gate structures. Then ions are implanted at a second energy level to form two more junctions, each of these two junctions being located between two of the earlier formed junctions. The junctions and the gate structures provide a transistor structure. The resulting transistor has a good short channel effect because the junction depths are preferably all aligned. It also has good drive current because the junctions created by ion implantation at a second energy level have low parasitic resistance.

16 Claims, 2 Drawing Sheets

36
36
7
8
9
15
15
15
10
10
10
34
34
30
30
28
28
28
28
27
26
25
24
16

48
48
7
8
9
46
46
15
15
15
10
10
10
34
34
30
30
28
28
28
28
27
29
26
25
28
24
16

TRANSISTOR AND METHOD OF MANUFACTURING A TRANSISTOR HAVING A SHALLOW JUNCTION FORMATION USING A TWO STEP EPI LAYER

BACKGROUND OF THE INVENTION

The present invention relates to transistors and methods of manufacturing transistors.

Semiconductor devices become more powerful every year. One of the reasons why the power of the devices has steadily increased is that, every year, there are more and more transistors placed on a device. Concurrent with, and part of, the effort to place more transistors on a device is an effort to reduce the size of transistors. This effort also necessarily involves basic fabrication techniques of transistor structures.

There are many challenges being faced by those attempting to reduce transistor size. One method of reducing transistor size has been to reduce the size of the structures within a transistor. For example, gate lengths and junction depths have been steadily reduced. It has been found, however, that junction depth is important to the performance of the transistor. For example, the depth of the source and drain junctions of a transistor can be important in ensuring that a gate has enough control over the electron flow in the transistor. Further, junction depth can be important in the contact process for the source and drain terminals.

Generally, there are shallow and deep junctions in transition, and they have different depths. The shallow junction is useful to provide current flow between the source and drain in the transistor, and to achieve improved short channel effect. The deep junction is useful to improve the source and drain contact process.

Nevertheless, the shallow junction is one of the methods used in reducing the transistor size. Care should be taken in the fabrication of transistors to ensure that the junction depths in the transistor do not adversely affect the performance characteristics of the transistor.

Accordingly, new methods of manufacturing transistors to achieve smaller size are needed.

SUMMARY OF THE INVENTION

The present invention allows the manufacture of transistors having a shallow junction by using a two step epitaxial layer process. In accordance with a preferred embodiment, the fabrication process involves first depositing a spacer on a wafer and around gate structures, and then etching the spacer from the wafer. In the next step, a first silicon epitaxial layer is grown on the wafer. Then, a second spacer is deposited on the first silicon epitaxial layer and around the gate structures. Then the second spacer is etched from the first silicon epitaxial layer such that the second spacer remains around the gate structures. Next a second silicon epitaxial layer is grown on the first silicon epitaxial layer. Then, the second spacer is etched from around the gate structures. Then, ions are implanted at a first energy level to form four shallow junctions in areas near the gate structures. A third spacer is deposited on the second silicon epitaxial layer and around the gate structures, and then etched, such that the third spacer remains around the gate structures. Then, ions are implanted at a second energy level to form fifth and sixth junctions. The fifth junction is formed between the first and second inventors, and the sixth junction is formed between the third and fourth inventors.

DESCRIPTION OF THE PREFERRED EMBODIMENT

Figure 3:
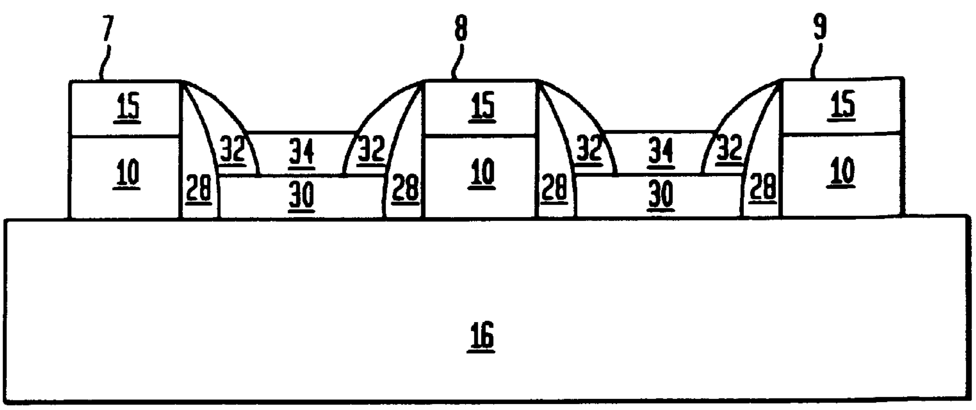
FIG. 3 illustrates a step in accordance with a preferred embodiment of the present invention wherein a second spacer is deposited and etched, and then a second silicon epitaxial layer is grown.
Figure 4:
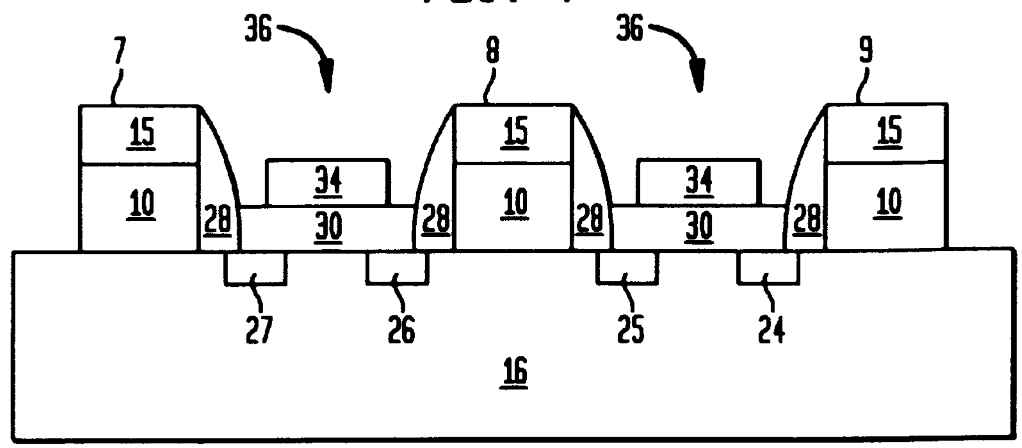
FIG. 4 illustrates a step in accordance with a preferred embodiment of the present invention wherein the second spacer is removed from around the gate structure and four junctions are formed by ion implantation.
Figure 5:
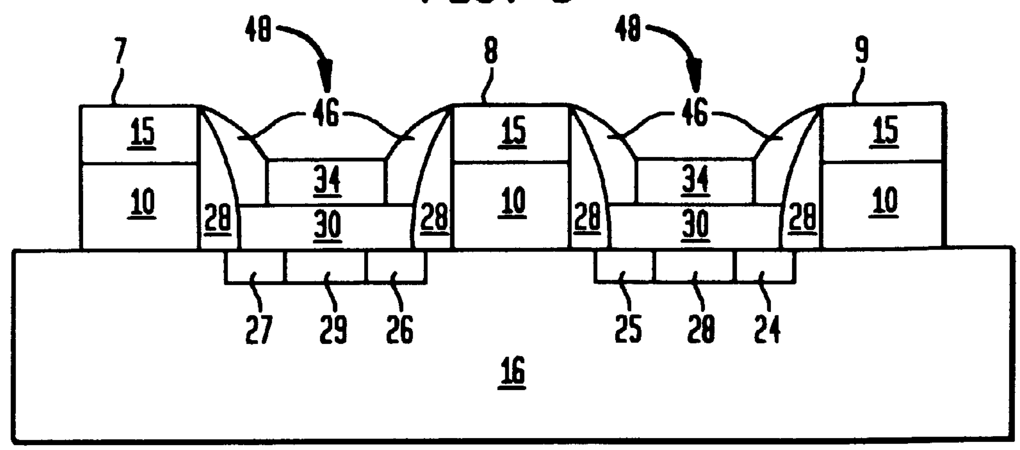
FIG. 5 illustrates a step in accordance with a preferred embodiment of the present invention wherein a third spacer is deposited and etched, and then fifth and sixth junctions are formed by ion implantation.

FIGS. 1 to 5 illustrate a preferred embodiment of a process for fabricating transistor structures. FIG. 5 also illustrates the transistor structure resulting from the fabrication process of FIGS. 1 to 5. The process generally involves the formation and use of two silicon epitaxial layers on the transistor structure. The process illustrated in FIGS. 1 to 5 is described with reference to the fabrication of DRAMs, however, the process can be used to fabricate other devices as well.

Figure 1:
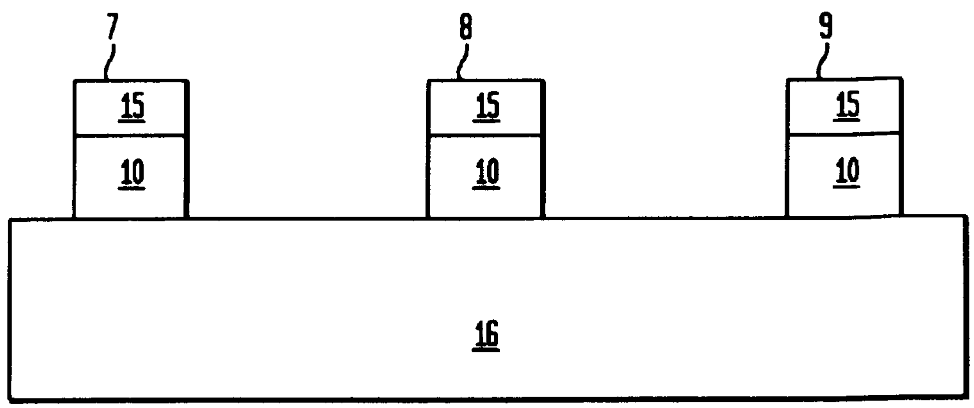
FIG. 1 illustrates a wafer having a plurality of gate structures on the wafer.

In FIG. 1, the results of several preliminary steps in the fabrication of a DRAM are illustrated, whereby gate structures 7, 8 and 9, each including structures 10 and 15, are formed on a wafer 16. The structures 10 are conductors and the structures 15 are insulators. These preliminary steps can be performed in accordance with well-known techniques of transistor fabrication.

Figure 2:
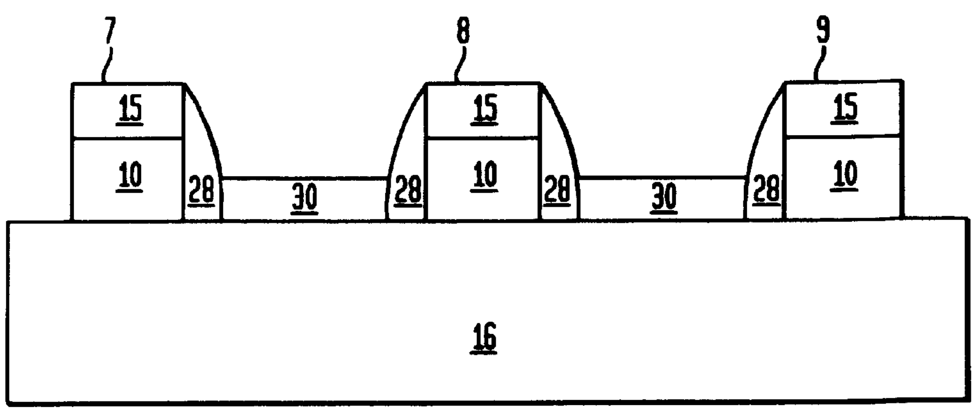
FIG. 2 illustrates a step in accordance with a preferred embodiment of the present invention wherein a first spacer is deposited and etched, and then a silicon epitaxial layer is grown.

In accordance with a preferred embodiment, a SIN spacer is deposited on the surface of the wafer 16 as well as on top of and around the gate structures 7, 8 and 9. Then the SIN spacer is etched to remove it from the surface of the wafer 16. As is illustrated in FIG. 2, after the deposition and etching of the spacer, a spacer structure 28 remains around the gate structures 7, 8 and 9. The spacer structure 28 will provide blocking of epi layer growth at the gate edge. The deposition and etching of spacers is well known, and can be accomplished in a variety of ways, with a variety of materials. The spacer structure 28 preferably is a nitride spacer, but any oxide spacer process can be utilized.

In the next step of the preferred embodiment, a silicon epitaxial layer 30 is grown on the surface of the wafer 16, as illustrated in FIG. 2. The thickness of the silicon epitaxial layer 30 is preferably in the range of 200 to 300 Angstroms, although the layer 30 may have a thickness outside this range. The thickness will depend on many different parameters, including but not limited to, the design parameters of the transistor being fabricated and the parameters of various steps of the fabrication process being used. The silicon epitaxial layer 30 can be fabricated using well-known techniques.

Then another spacer is deposited on the silicon epitaxial layer 30 and around the gate structures 7, 8 and 9. This spacer is then etched to remove it from the silicon epitaxial layer 30. As is illustrated in FIG. 3, after the deposition and etching of the spacer, another spacer structure 32 remains around the gate structures 7, 8 and 9. The spacer structure 32 will provide blocking of epi layer growth. As previously mentioned, the deposition and etching of spacers is well known, and can be accomplished in a variety of ways, with a variety of materials. The spacer structure 32 preferably is fabricated using oxide deposition, and any oxides can be utilized.

In the next step of the preferred embodiment, a second silicon epitaxial layer 34 is grown on the surface of the first silicon epitaxial layer 30, as illustrated in FIG. 3. The second silicon epitaxial layer 34 is not grown as close to the gate structures 7, 8 and 9 as the first silicon epitaxial layer 30 due to the second spacer 32. As will become apparent, this structure of the epitaxial layers 30 and 34 will allow the fabrication of junctions so that different areas of the junctions will have different characteristics.

The thickness of the second silicon epitaxial layer 34 is preferably thicker than the thickness of the first silicon epitaxial layer 30, but need not be so. Thus, the thickness of the second silicon epitaxial layer 34 can be the same as, or less than, the thickness of the first silicon epitaxial layer 30. In accordance with a preferred embodiment of the present invention, the thickness of the second silicon epitaxial layer 34 is in the range of 300 to 400 Angstroms. As with the first silicon epitaxial layer 30, the second silicon epitaxial layer 34 may have a thickness outside this range. Also, as with the first silicon epitaxial layer 30, the thickness of the second silicon epitaxial layer 34 will depend on many different parameters, including but not limited to, the design parameters of the transistor being fabricated and the parameters of various steps of the fabrication process being used.

In the next step of the preferred embodiment, the second spacer 32 is removed using oxide removal. Once the second spacer 32 is removed, the structure remaining is illustrated in FIG. 4. As shown in FIG. 4, the junctions 24, 25, 26 and 27 are formed through ion implantation. The step of ion implantation is illustrated as arrows 36. The junctions 24, 25, 26 and 27 can be formed using plasma conversion implantation, also referred to as plasma doping. These junctions 24, 25, 26 and 27 are formed near the gate structures 7, 8 and 9, as illustrated. The energy associated with the step of ion implantation is preferably low, such as is typically used to from a shallow junction. In accordance with one aspect of the present invention, the implantation energy is in the range of 5 keV to 10 keV. The implantation energy can also be in the range of 1 keV to 10 keV. Other implantation energy levels can be used during this step.

After the ion implantation step, another spacer is deposited on the second silicon epitaxial layer 34 and around the gate structures 7, 8 and 9. This spacer is then etched to remove it from the second silicon epitaxial layer 34. As is illustrated in FIG. 5, after the deposition and etching of the spacer, there is another spacer structure 46 that remains around the gate structures 7, 8 and 9. The spacer structure 46 will provide blocking of deep implantation below the spacer structure 46. As previously mentioned, the deposition and etching of spacers is well known, and can be accomplished in a variety of ways, with a variety of materials. The spacer structure 46 preferably is fabricated using BPSG oxide deposition, but any insulators can be utilized.

Then, as illustrated in FIG. 5, the junctions 28 and 29 are further formed by a second step of ion implantation. The second step of ion implantation is illustrated by arrows 48. The junction 28 is formed between the junctions 24 and 25. The junction 29 is formed between the junctions 26 and 27. These junctions 24 to 29 provide electrical communications between gate structures 7, 8 and 9 as required for transistor operation.

The energy associated with the second step of ion implantation is preferably higher than the energy associated with the first step of ion implantation. Thus, the energy level used in the second step of ion implementation can be the same as is typically used to from a deep junction. In accordance with a preferred embodiment of the present invention, the implantation energy used in the second step of ion implantation is 30 keV. In another embodiment, the implantation energy is 20 keV. Other implantation energy levels can also be used during this step.

The resulting transistor structure is shown in FIG. 5. In accordance with a preferred embodiment, each of the junction areas 24 to 29 have the same depth. This allows improved short channel effect. The depth of the junction areas may, however, be different due to process factors.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A method of manufacturing a transistor from a wafer having gate structures on the wafer, comprising the steps of:

depositing a first spacer on the wafer and around the gate structures, and then etching the first spacer from the wafer such that the first spacer remains around the gate structures;

growing a first silicon epitaxial layer on the wafer;

depositing a second spacer on the first silicon epitaxial layer and around the gate structures, and then etching the second spacer from the first silicon epitaxial layer such that the second spacer remains around the gate structures;

growing a second silicon epitaxial layer on the first silicon epitaxial layer;

etching the second spacer from around the gate structures;

implanting ions to create a first, a second, a third and a fourth junction area;

depositing a third spacer on the second silicon epitaxial layer and around the gate structures, and etching the third spacer from the second silicon epitaxial layer such that the third spacer remains around the gate structures; and implanting ions to create a fifth and a sixth junction area.

2. The method of claim 1, wherein the first, second, third and fourth junction areas are located near gate structures.

3. The method of claim 2, wherein the fifth junction area is located between the first and the second junction areas and the sixth junction area is located between the third and the fourth junction areas.

4. The method of claim 3, wherein the first, second, third and fourth junction areas have a first set of characteristics and the fifth and sixth junction areas have a second set of characteristics.

5. The method of claim 1, wherein the fifth junction area is located between the first and the second junction areas and the sixth junction area is located between the third and the fourth junction areas.

6. The method of claim 1, wherein the step of implanting ions to create the first, second, third and fourth junction areas uses a first energy level and the step of implanting ions to create the fifth and sixth junction areas uses a second energy level.

7. The method of claim 6, wherein the first, second, third and fourth junction areas have a first set of characteristics and the fifth and sixth junction areas have a second set of characteristics.

8. The method of claim 6, wherein the first energy level is in the range of 1 keV to 10 keV.

9. The method of claim 8, wherein the second energy level is 30 keV.

10. The method of claim 8, wherein the second energy level is in the range of 10 to 30 keV.

11. The method of claim 6, wherein the first energy level is in the range of 5 keV to 10 keV.

12. The method of claim 11, wherein the second energy level is 30 keV.

13. The method of claim 11, wherein the second energy level is in the range of 10 to 30 keV.

14. The method of claim 1, wherein the thickness of the second epitaxial layer of silicon is greater than the thickness of the first epitaxial layer of silicon.

15. The method of claim 14, wherein the thickness of the first epitaxial layer of silicon is in the range of 200 to 300 angstroms and the thickness of the second epitaxial layer of silicon is in the range of 300 to 400 angstroms.

16. The method of claim 1, wherein the first through sixth junction areas all have the same depth.

* * * * *